(12) United States Patent
Xu

(10) Patent No.: US 10,468,600 B2
(45) Date of Patent: Nov. 5, 2019

(54) METHOD OF FABRICATING AN ORGANIC ELECTROLUMINESCENT DISPLAY DEVICE

(71) Applicant: Wuhan China Star Optoelectronics Technology Co., Ltd., Wuhan, Hubei (CN)

(72) Inventor: Chao Xu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 208 days.

(21) Appl. No.: 15/532,398

(22) PCT Filed: Apr. 12, 2017

(86) PCT No.: PCT/CN2017/080181
§ 371 (c)(1),
(2) Date: Jun. 1, 2017

(87) PCT Pub. No.: WO2018/152941
PCT Pub. Date: Aug. 30, 2018

(65) Prior Publication Data
US 2019/0097136 A1    Mar. 28, 2019

(30) Foreign Application Priority Data

Feb. 24, 2017  (CN) .......................... 2017 1 0104463

(51) Int. Cl.
*H01L 51/40*      (2006.01)
*H01L 21/00*      (2006.01)
(Continued)

(52) U.S. Cl.
CPC ........ *H01L 51/0024* (2013.01); *H01L 51/003* (2013.01); *H01L 51/524* (2013.01);
(Continued)

(58) Field of Classification Search
CPC ............. H01L 51/0024; H01L 51/5253; H01L 51/5262; H01L 51/56
See application file for complete search history.

(56) References Cited

U.S. PATENT DOCUMENTS

| | | | |
|---|---|---|---|
| 6,998,648 B2 * | 2/2006 | Silvernail | H01L 51/5246 257/100 |
| 2012/0007107 A1 * | 1/2012 | Choi | H01L 51/5253 257/88 |

(Continued)

*Primary Examiner* — Alonzo Chambliss
(74) *Attorney, Agent, or Firm* — Andrew C. Cheng

(57) ABSTRACT

A method for manufacturing an organic electroluminescent display device is provided, which includes the steps of: providing a lower support substrate and an upper support substrate; making a lower flexible substrate and an organic electroluminescent device layer on the lower support substrate sequentially, making an upper flexible substrate and an adhesive layer on the upper support substrate sequentially; aligning the lower support substrate and the upper support substrate, to thereby attach the adhesive layer and the organic electroluminescent device layer; and peeling the lower support substrate and the upper support substrate. An organic electroluminescent display device made by the above manufacturing method is also provided. Accordingly, it can effectively solve the separating problem of a rigid substrate (a support substrate) and a flexible substrate, and the organic electroluminescent device is packaged directly in the manufacturing process, without additional thin film packaging device, therefore the manufacturing cost is greatly reduced.

18 Claims, 4 Drawing Sheets

(51) Int. Cl.
*H01L 21/30* (2006.01)
*H01L 29/08* (2006.01)
*H01L 31/0232* (2014.01)
*H01L 51/00* (2006.01)
*H01L 51/56* (2006.01)
*H01L 51/52* (2006.01)
H01L 27/32 (2006.01)

(52) U.S. Cl.
CPC ...... *H01L 51/5253* (2013.01); *H01L 51/5262* (2013.01); *H01L 51/56* (2013.01); *H01L 27/3244* (2013.01); *H01L 2227/323* (2013.01); *H01L 2227/326* (2013.01)

(56) References Cited

U.S. PATENT DOCUMENTS

| | | | |
|---|---|---|---|
| 2014/0183478 A1* | 7/2014 | Lee | H01L 51/56 257/40 |
| 2016/0043336 A1 | 2/2016 | Kim | |
| 2016/0099428 A1* | 4/2016 | Lee | H01L 51/56 257/40 |

\* cited by examiner

METHOD OF FABRICATING AN ORGANIC ELECTROLUMINESCENT DISPLAY DEVICE

FIELD OF THE INVENTION

The present disclosure related to a field of display technology, and in particular it relates to an organic electroluminescent display device and a method for manufacturing thereof.

BACKGROUND OF THE INVENTION

In recent years, Organic Light-Emitting Diode (OLED) has become very popular emerging flat-panel display device product at home and abroad. This is because the OLED display device has characters of self-emission, wide viewing angle, short reaction time, high luminous efficiency, wide color gamut, low operating voltage, thin thickness, available for making large size panel, flexible, and simple process and so on. Also, it has the potential of low cost.

In flexible OLED display device manufacturing process, the production process is difficult to control, since the deformation of the flexible substrate is easily occurred. Therefore, the development of current flexible OLED display device is greatly restricted.

Currently, a method for manufacturing a flexible OLED display device mainly comprises the following steps: attaching a flexible substrate on a rigid substrate, and separating the rigid substrate from the flexible substrate after finishing an OLED display device. However, since the rigid substrate and the flexible substrate are tightly attached, it is difficult to separate the two after finishing the OLED device.

In addition, making a flexible OLED display device is usually adopting thin film packaging, it cannot be achieved by traditional glass packaging. Also, thin film packaging requires additional purchase of expensive thin film packaging equipment, thus the manufacturing cost of the flexible OLED display device is increased.

SUMMARY OF THE INVENTION

To solve the above technical problems, the objective of the present disclosure is providing an organic electroluminescent display device and a method of manufacturing thereof.

According to one aspect of the present disclosure, a method of manufacturing an organic electroluminescent display device is provided, which comprises the steps of: providing a lower support substrate and an upper support substrate; making a lower flexible substrate and an organic electroluminescent device layer on the lower support substrate sequentially, and making an upper flexible substrate and an adhesive layer on the upper support substrate sequentially; aligning the lower support substrate and the upper support substrate, to thereby attach the adhesive layer and the organic electroluminescent device layer; and peeling the lower support substrate and the upper support substrate.

Preferably, the step of making the lower flexible substrate on the lower support substrate comprises: coating a flexible material on the lower support substrate and curing the flexible material, or attaching a complete lower flexible substrate to the lower support substrate by an adhesive; the step of making the upper flexible substrate on the upper support substrate comprise: coating a flexible material on the upper support substrate, and curing the flexible material, or attaching a complete upper flexible substrate to the upper support substrate by an adhesive.

Preferably, the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: disposing a release film layer between the upper flexible substrate and the upper support substrate, to thereby automatically separate the upper support substrate and the upper flexible substrate, or separating the upper support substrate and the upper flexible substrate by excimer laser.

Preferably, before the step of making the adhesive layer on the flexible substrate, further comprises: forming a passivation layer on the upper flexible substrate for improving water and oxygen barrier capability of the upper flexible substrate.

Preferably, before the step of making the lower flexible substrate on the lower support substrate, further comprises: making a light extraction layer on the lower flexible substrate, for increasing water and oxygen barrier capacity of the lower flexible substrate, and increasing light transmittance.

Preferably, before the step of disposing the lower flexible substrate on the release film layer, further comprises: making a light extraction layer on the release layer, for increasing water and oxygen barrier capacity of the lower flexible substrate, and increasing light transmittance.

Preferably, a material of the release film layer is photoresist or organic silicon.

Preferably, a material of the light extraction layer is titanium dioxide.

Preferably, a material of the adhesive layer is UV-curing adhesive.

According to another aspect of the present disclosure, there is also providing an organic electroluminescent display device made by the above manufacturing method.

The beneficial effects of the present disclosure are: by using the manufacturing method to make an organic electroluminescent display device disclosure, can effectively solve the separating problem of the rigid substrate (i.e., a support substrate) and the flexible substrate, and the organic electroluminescent device is packaged directly in the manufacturing process, without additional use of thin film packaging device, to thereby reduce the production costs greatly.

BRIEF DESCRIPTION OF THE DRAWING

The following description in conjunction with the accompanying drawings, the above and other aspects, features and advantages of the embodiments of the present disclosure will become more apparent from the accompanying drawings in which.

DETAILED DESCRIPTION OF THE PREFERRED EMBODIMENTS

Figure 1A:
FIG. 1A to FIG. 1D are process diagrams of an organic electroluminescent display device according to one embodiments of the present disclosure.
Figure 1A:

Hereinafter, embodiments of the present disclosure will be described in detail with reference to the accompanying drawings. However, be in many different forms and embodiments of the present disclosure, and the disclosure should not be construed as limited to the specific embodiments set forth herein. Rather, these embodiments are provided to explain the principles of the disclosure and its practical application so that others skilled in the art to understand the disclosure for various embodiments and various modifications suited to the particular intended application.

In the drawings, for clarity the devices, exaggerate the thickness of the layers and regions. The same reference numerals throughout the specification and the drawings can be used to denote the same elements.

It will be appreciated that, when such a layer, film, region or substrate is referred to as "in," "on" another element, the element can be directly on the other element, or intervening elements may also be present. Alternatively, when an element is referred to as being "directly" being "on" another element, there are no intervening elements.

FIG. 1A to FIG. 1D are process diagrams of an organic electroluminescent display device according to one embodiment of the present disclosure.

A method for manufacturing an organic electroluminescent display device according to one embodiment of the present disclosure comprises the steps of:

Step 1: referring to FIG. 1A, providing a lower support substrate 110 and an upper support substrate 210.

Herein, the lower support substrate 110 and the upper support substrate 210 can be made of glass, ceramic or metal. The thickness of the lower support substrate 110 and the upper support substrate 210 is between 0.5 mm and 1 mm. In the present embodiment, the lower support substrate 110 and the upper support substrate 210 are preferably made of glass, and the thickness of the lower support substrate 110 and the upper support substrate 210 is preferably 0.7 mm.

Figure 1B:
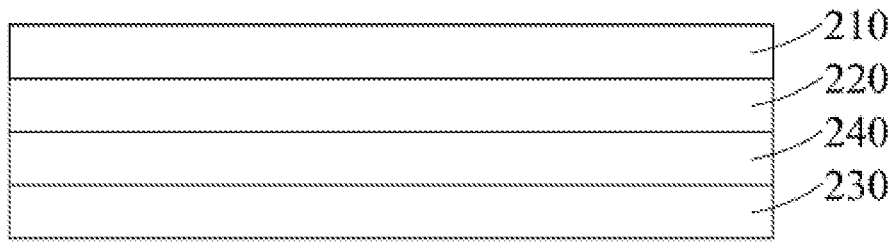
Figure 1B:
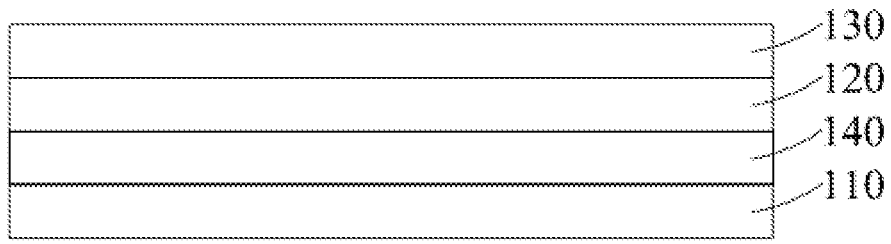

Step 2: referring to FIG. 1B, making a lower flexible substrate 120 and an organic electroluminescent light emitting device layers 130 sequentially on the lower support substrate 110, and making an upper flexible substrate 220 and an adhesive layer 230 sequentially on the upper support substrate 210.

Herein, the organic electroluminescent light emitting device layers 130 includes a plurality thin film transistors arranged in array (not shown) and a plurality of organic electroluminescent devices arranged in array (not shown), wherein the emission of each organic electroluminescent device is controlled by a corresponding thin film transistor. In the present embodiment, the material of the adhesive layer 230 is preferably a UV curing adhesive, but disclosure is not limited thereto.

Further, the flexible substrate (the lower flexible substrate 120 or the upper flexible substrate 220) can be disposed by selecting one of the following two processes:

Process one: coating a flexible material (i.e., a material of making the flexible substrate) on the support substrate (the lower support substrate 110 or the upper support substrate 210) by spin coating, slit coating, inkjet coating, etc., and curing the flexible material.

Process two: attaching a complete flexible substrate made of the flexible material to the support substrate by applying an adhesive therebetween. In some embodiments, the flexible substrate may comprise not only one organic layer, but also two or more organic layers. Within the organic layer, it may further comprise one, two or more inorganic layers, wherein the inorganic layer can be made of SiNx and/or SiOx or the like.

Further, before the step of forming the adhesive layer 230 on the upper flexible substrate 220, first forming a passivation layer 240 on the upper flexible substrate 220. The passivation layer 240 is used for improving water oxygen barrier capability of the upper flexible substrate 220. It should be understood that, in another embodiment of the present disclosure, the passivation layer 240 can also be dismissed.

Furthermore, before the step of making the lower flexible substrate 120 on the lower support substrate 110, making a light extraction layer 140 on the lower flexible substrate 110. The light extraction layer 140 is used for improving water and oxygen barrier capacity of the lower flexible substrate 120, as well as increasing light transmittance. It should be noted that, in preferably, a material for the light extraction layer 140 may be an inorganic transparent material such as titanium dioxide.

Figure 1C:
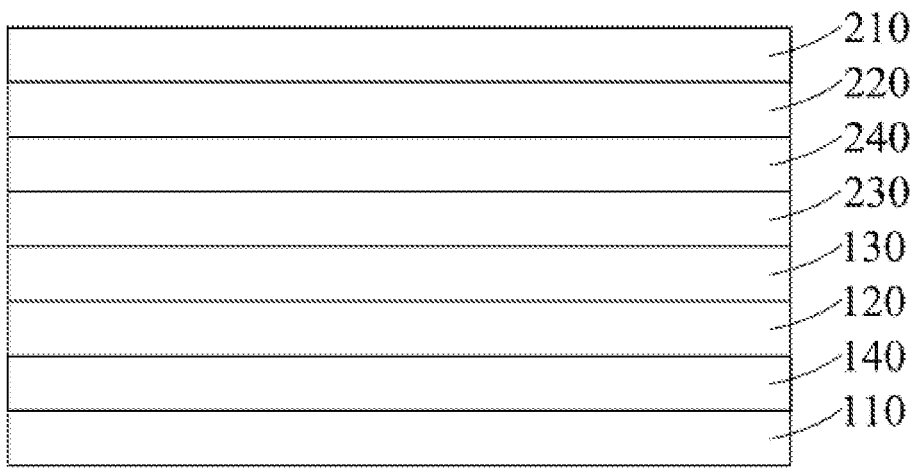

Step 3: referring to FIG. 1C, aligning the lower support substrate 110 and the upper support substrate 210, to thereby attach the adhesive layer 230 and the electroluminescent device layer 130.

Figure 1D:
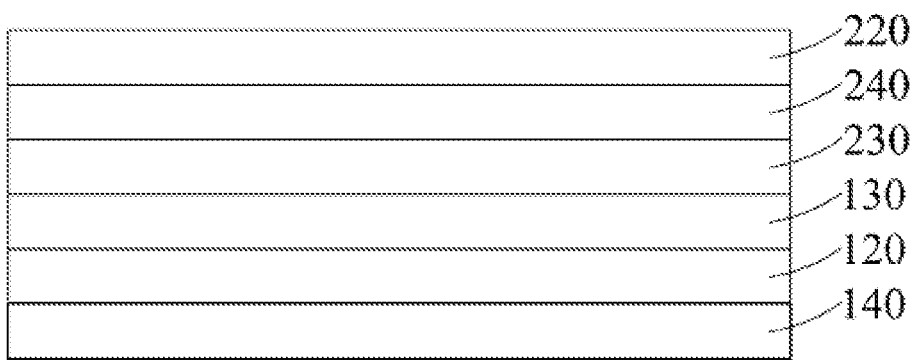

Step 4: referring to FIG. 1D, peeling the lower support substrate 110 and the upper support substrate 210.

Further, the method of peeling the lower support substrate 110 or the upper support substrate 210 is particularly: separating the lower support substrate 110 by excimer laser; and separating the upper support substrate 210 by excimer laser.

FIG. 2A to FIG. 2D are process diagrams of an organic electroluminescent display device according to another embodiment of the present disclosure.

Figure 2A:
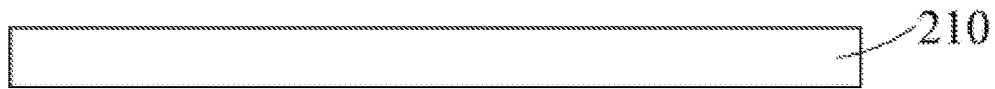
FIG. 2A to FIG. 2D are process diagrams of an organic electroluminescent display device according to another embodiment of the present disclosure.
Figure 2A:
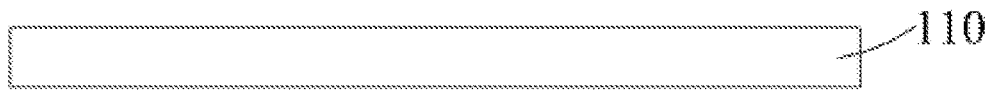

The manufacturing method of an organic electroluminescent display device according to another embodiment of the present disclosure comprises the steps of:

Step 1: referring to FIG. 2A, providing a lower support substrate 110 and an upper support substrate 210.

Herein, the lower support substrate 110 and the upper support substrate 210 can be made of glass, ceramic or metal. The thickness of the lower support substrate 110 and the upper support substrate 210 is between 0.5 mm and 1 mm. In the present embodiment, the lower support substrate 110 and the upper support substrate 210 are preferably made of glass, and the thickness of the lower support substrate 110 and the upper support substrate 210 is preferably 0.7 mm.

Figure 2B:
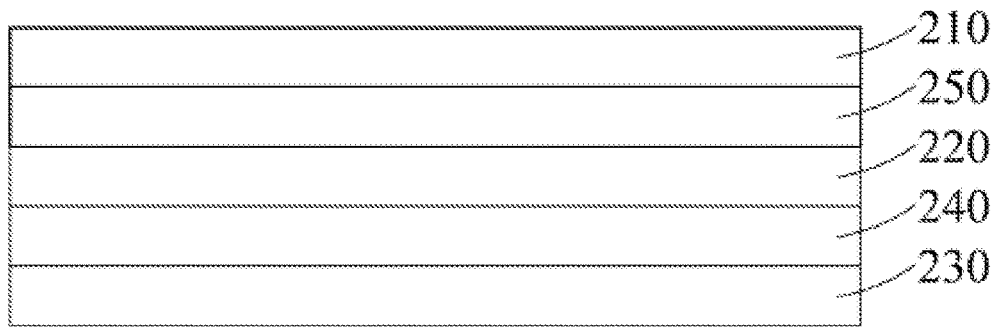
Figure 2B:
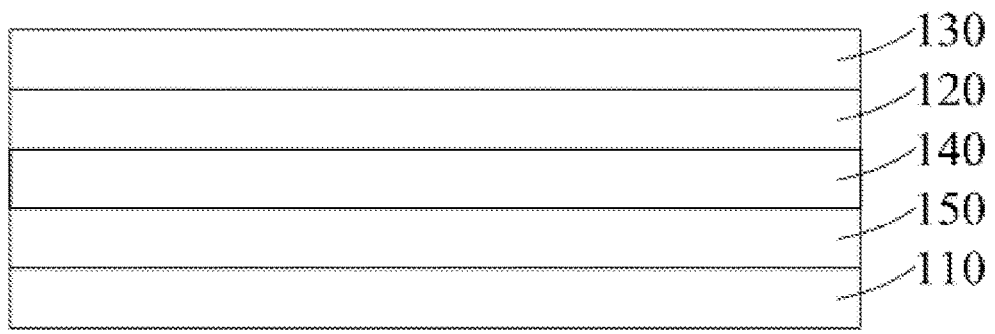
Figure 2C:
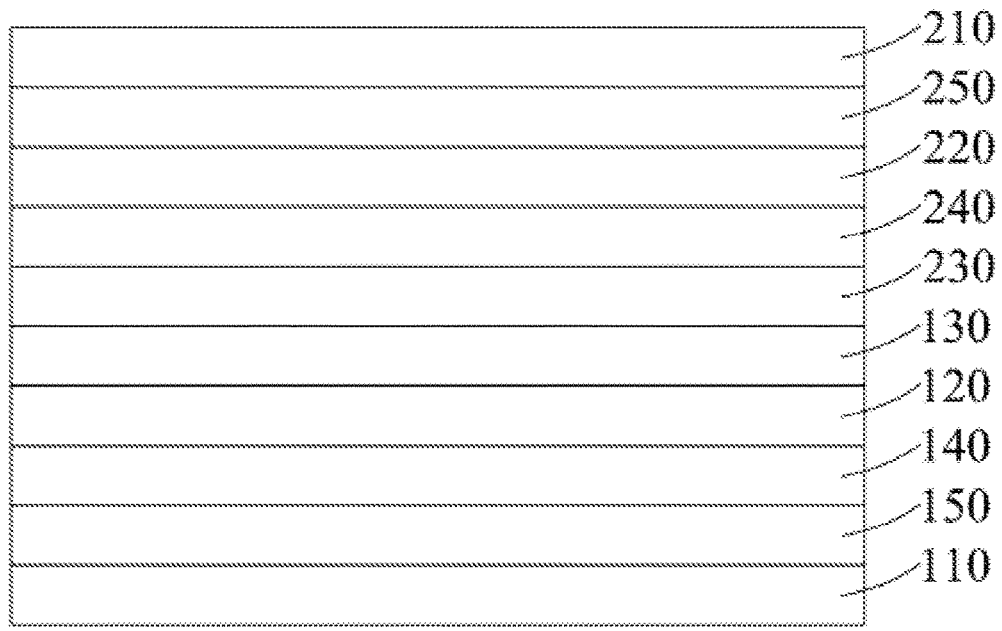
Figure 2D:

Step 2: referring to FIG. 2B, making a lower release film layer 150, a lower flexible substrate 120 and an electroluminescent device layer 130 sequentially on the lower support substrate 110, and making an upper release film layer 250, an upper flexible substrate 220 and an adhesive layer 230 sequentially on the upper support substrate 210.

Herein, the organic electroluminescent light emitting device layers 130 includes a plurality of thin film transistors arranged in array (not shown), and a plurality of organic electroluminescent devices arranged in array (not shown), wherein the emission of each organic electroluminescent device is controlled by a corresponding thin film transistor. In the present embodiment, the material of the release film (the lower release film 150 and the upper release film 250) is preferably a photoresist or organic silicon, but disclosure is not limited thereto.

Further, the flexible substrate (the lower flexible substrate 120 or the upper flexible substrate 220) can be disposed by selecting one of the following two processes:

Process one: coating a flexible material (i.e. a material of making the flexible substrate) on the release film layer (the lower release film layer 150 and the upper release film layer 250) by spin coating, slit coating, inkjet coating, etc., and curing the flexible material.

Process two: attaching a complete flexible substrate made of the flexible material to the support substrate by applying an adhesive therebetween. In some embodiments, the flexible substrate may comprise not only an organic layer, but also two or more organic layers. Within the organic layer, it may further comprise one, two or more inorganic layers, wherein the inorganic layer can be made of SiNx and/or SiOx or the like.

Further, before the step of making the adhesive layer 230 on the upper flexible substrate 220, first forming a passivation layer 240 on the upper flexible substrate 220. The passivation layer 240 is used for improving water and oxygen barrier capability of the upper flexible substrate 220. It should be understood that, in another embodiment of the present disclosure, the passivation layer 240 can also be dismissed.

Furthermore, before the step of making the lower flexible substrate 120 on the lower release film layer 150, making a light extraction layer 140 on the lower release film layer 150. The light extraction layer 140 is used for improving water and oxygen barrier capacity of the lower flexible substrate 120, as well as increasing light transmittance. It should be noted that, in preferably, a material for the light extraction layer 140 may be an inorganic transparent material such as titanium dioxide.

Step 3: referring to FIG. 1C, aligning the lower support substrate 110 and the upper support substrate 210, to thereby attach the adhesive layer 230 and the electroluminescent device layer 130.

Step 4: referring to FIG. 1D, peeling the lower support substrate 110 and the upper support substrate 210.

Further, the method of peeling the lower support substrate 110 or the upper support substrate 210 is particularly: because of deposing the lower release film layer 150 on the lower support substrate 110, the lower support substrate 110 is peeled by the lower release film layer 150. Similarly, because of deposing the upper release film layer 250 on the upper support substrate 210, the upper support substrate 210 is peeled by the upper release film layer 250.

In summary, in the process of making an organic electroluminescent display device, the manufacturing methods of the embodiments can effectively solve the separating problem of the rigid substrate (i.e., a support substrate) and the flexible substrate. And, in the manufacturing method, the organic electroluminescent device is packaged directly in the manufacturing process, without additional thin film packaging device. Therefore, the manufacturing cost is greatly reduced.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. A method of manufacturing an organic electroluminescent display device, comprising the steps of: providing a lower support substrate and an upper support substrate; making a lower flexible substrate and an organic electroluminescent device layer on the lower support substrate sequentially, and making an upper flexible substrate and an adhesive layer on the upper support substrate sequentially; aligning the lower support substrate and the upper support substrate, to thereby attach the adhesive layer and the organic electroluminescent device layer; and peeling the lower support substrate and the upper support substrate;

wherein before the step of making the adhesive layer on the upper flexible substrate, further comprises: making a passivation layer on the upper flexible substrate for improving water and oxygen barrier capability of the upper flexible substrate;

wherein the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: disposing a release film layer between the upper flexible substrate and the upper support substrate, to thereby automatically separate the upper support substrate and the upper flexible substrate, or separating the upper support substrate and the upper flexible substrate by excimer laser; and wherein before the step of disposing the lower flexible substrate on the release film layer, further comprises: making a light extraction layer on the release layer for improving water and oxygen barrier capacity of the lower flexible substrate, and increasing light transmittance.

2. The method of manufacturing the organic electroluminescent display device according to claim 1, wherein the step of making the lower flexible substrate on the lower support substrate comprises: coating a flexible material on the lower support substrate and curing the flexible material, or attaching a complete lower flexible substrate to the lower support substrate by an adhesive; the step of making the upper flexible substrate on the upper support substrate comprise: coating a flexible material on the upper support substrate and curing the flexible material, or attaching a complete upper flexible substrate to the upper support substrate by an adhesive.

3. The method of manufacturing the organic electroluminescent display device according to claim 1, wherein a material of the release film layer is photoresist or organic silicon.

4. The method of manufacturing the organic electroluminescent display device according to claim 1, wherein a material of the light extraction layer is titanium dioxide.

5. The method of manufacturing the organic electroluminescent display device according to claim 1, wherein a material of the adhesive layer is UV-curing adhesive.

6. An organic electroluminescent display device, which is manufactured by the manufacturing method according to claim 1.

7. A method of manufacturing an organic electroluminescent display device, comprising the steps of: providing a lower support substrate and an upper support substrate; making a lower flexible substrate and an organic electroluminescent device layer on the lower support substrate sequentially, and making an upper flexible substrate and an adhesive layer on the upper support substrate sequentially; aligning the lower support substrate and the upper support substrate, to thereby attach the adhesive layer and the organic electroluminescent device layer; and peeling the lower support substrate and the upper support substrate;

wherein before the step of making the lower flexible substrate on the lower support substrate, further comprises: making a light extraction layer on the lower flexible substrate for improving water and oxygen barrier capacity of the lower flexible substrate, and increasing light transmittance.

8. The method of manufacturing the organic electroluminescent display device according to claim 7, wherein a material of the light extraction layer is titanium dioxide.

9. The method of manufacturing the organic electroluminescent display device according to claim 7, wherein the step of making the lower flexible substrate on the lower support substrate comprises: coating a flexible material on the lower support substrate and curing the flexible material, or attaching a complete lower flexible substrate to the lower support substrate by an adhesive; the step of making the upper flexible substrate on the upper support substrate comprise: coating a flexible material on the upper support substrate and curing the flexible material, or attaching a complete upper flexible substrate to the upper support substrate by an adhesive.

10. The method of manufacturing the organic electroluminescent display device according to claim 9, wherein the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: providing a release film layer between the upper flexible substrate and the upper support substrate, to thereby automatically separate the upper support substrate and the upper flexible substrate, or separating the upper support substrate and the upper flexible substrate by excimer laser.

11. The method of manufacturing the organic electroluminescent display device according to claim 7, wherein the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: disposing a release film layer between the upper flexible substrate and the upper support substrate, to thereby automatically separate the upper support substrate and the upper flexible substrate, or separating the upper support substrate and the upper flexible substrate by excimer laser.

12. An organic electroluminescent display device, which is manufactured by the method according to claim 7.

13. A method of manufacturing an organic electroluminescent display device, comprising the steps of: providing a lower support substrate and an upper support substrate; making a lower flexible substrate and an organic electroluminescent device layer on the lower support substrate sequentially, and making an upper flexible substrate and an adhesive layer on the upper support substrate sequentially; aligning the lower support substrate and the upper support substrate, to thereby attach the adhesive layer and the organic electroluminescent device layer; and peeling the lower support substrate and the upper support substrate;

wherein before the step of making the adhesive layer on the upper flexible substrate, further comprises: making a passivation layer on the upper flexible substrate for improving water and oxygen barrier capability of the upper flexible substrate;

wherein before the step of making the lower flexible substrate on the lower support substrate, further comprises: making a light extraction layer on the lower flexible substrate for improving water and oxygen barrier capacity of the lower flexible substrate, and increasing light transmittance; and wherein a material of the light extraction layer is titanium dioxide.

14. The method of manufacturing the organic electroluminescent display device according to claim 13, wherein the step of making the lower flexible substrate on the lower support substrate comprises: coating a flexible material on the lower support substrate and curing the flexible material, or attaching a complete lower flexible substrate to the lower support substrate by an adhesive; the step of making the upper flexible substrate on the upper support substrate comprise: coating a flexible material on the upper support substrate and curing the flexible material, or attaching a complete upper flexible substrate to the upper support substrate by an adhesive.

15. The method of manufacturing the organic electroluminescent display device according to claim 14, wherein the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: providing a release film layer between the upper flexible substrate and the upper support substrate, to thereby automatically separate the upper support substrate and the upper flexible substrate, or separating the upper support substrate and the upper flexible substrate by excimer laser.

16. The method of manufacturing the organic electroluminescent display device according to claim 13, wherein the step of peeling the lower support substrate comprises: disposing a release film layer between the lower flexible substrate and the lower support substrate, to thereby automatically separate the lower support substrate and the lower flexible substrate, or separating the lower support substrate and the lower flexible substrate by excimer laser; the step of peeling the upper support substrate comprises: disposing a release film layer between the upper flexible substrate and the upper support substrate, to thereby automatically separate the upper support substrate and the upper flexible substrate, or separating the upper support substrate and the upper flexible substrate by excimer laser.

17. The method of manufacturing the organic electroluminescent display device according to claim 16, wherein a material of the release film layer is photoresist or organic silicon.

18. An organic electroluminescent display device, which is manufactured by the method according to claim 13.

* * * * *